United States Patent [19]

Mizuta et al.

[11] 4,352,104
[45] Sep. 28, 1982

[54] REMOTE METER READING APPARATUS

[75] Inventors: Toshiaki Mizuta; Takeshi Abe; Ichiro Yoshihara; Kazuhito Saito, all of Tokyo, Japan

[73] Assignee: Ricoh Company, Ltd., Tokyo, Japan

[21] Appl. No.: 146,570

[22] Filed: May 5, 1980

[30] Foreign Application Priority Data

May 7, 1979 [JP] Japan .................................. 54-54753

[51] Int. Cl.³ ........................ H04Q 9/06; G08B 19/36
[52] U.S. Cl. ............................ 340/825.15; 340/825.62; 340/870.02
[58] Field of Search ............... 340/151, 152 R, 870.02, 340/870.03, 870.39; 235/92 EL

[56] References Cited

U.S. PATENT DOCUMENTS

| | | | |
|---|---|---|---|
| 3,706,086 | 12/1972 | Farnsworth | 340/870.02 |
| 3,820,073 | 6/1974 | Vercellotti et al. | 340/870.02 |
| 4,132,981 | 1/1979 | White | 340/870.02 |
| 4,208,653 | 6/1980 | Abe | 340/870.03 |

Primary Examiner—Donald J. Yusko
Attorney, Agent, or Firm—David G. Alexander

[57] ABSTRACT

A remote meter reading unit (22) feeds clock pulses to a meter (23) over a transmission line (34). The meter (23), in synchronism with the clock pulses, feeds a predetermined number of synchronization signals, a predetermined number of meter data signals and a predetermined number of redundancy signals back to the reading unit (22).

11 Claims, 14 Drawing Figures

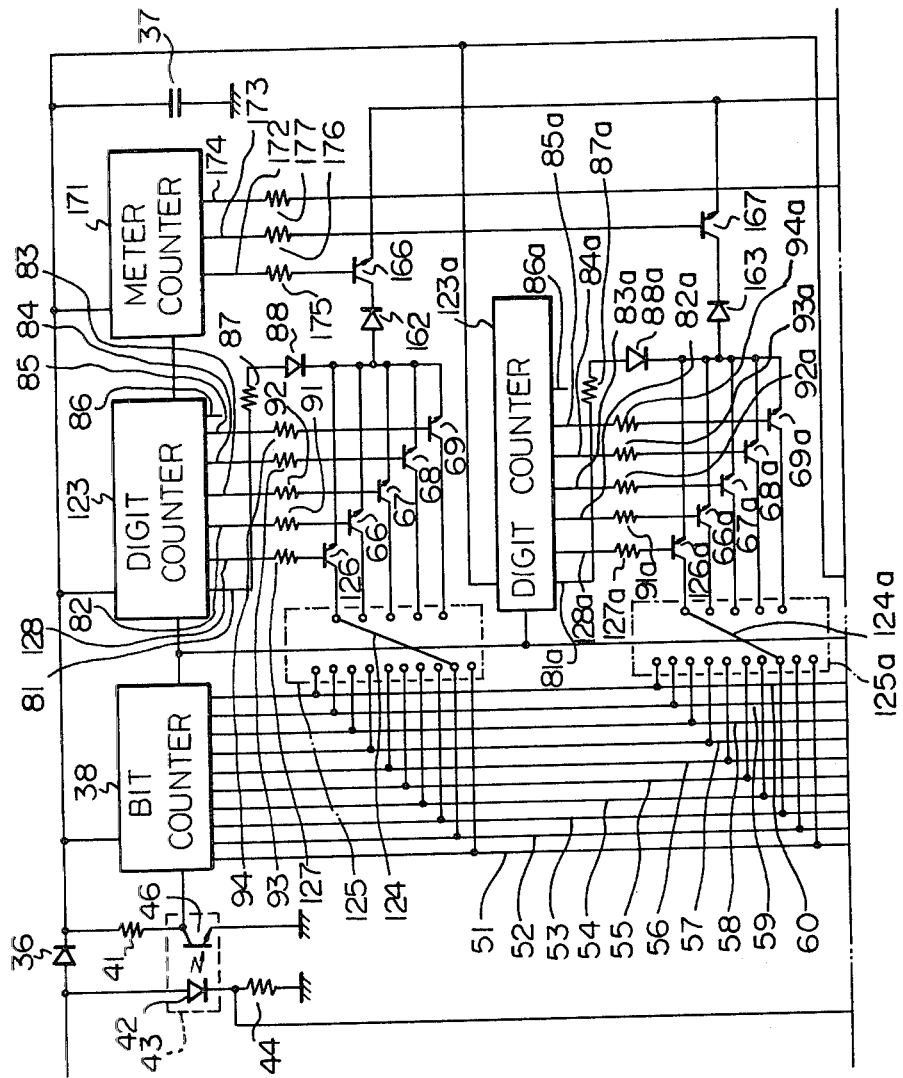

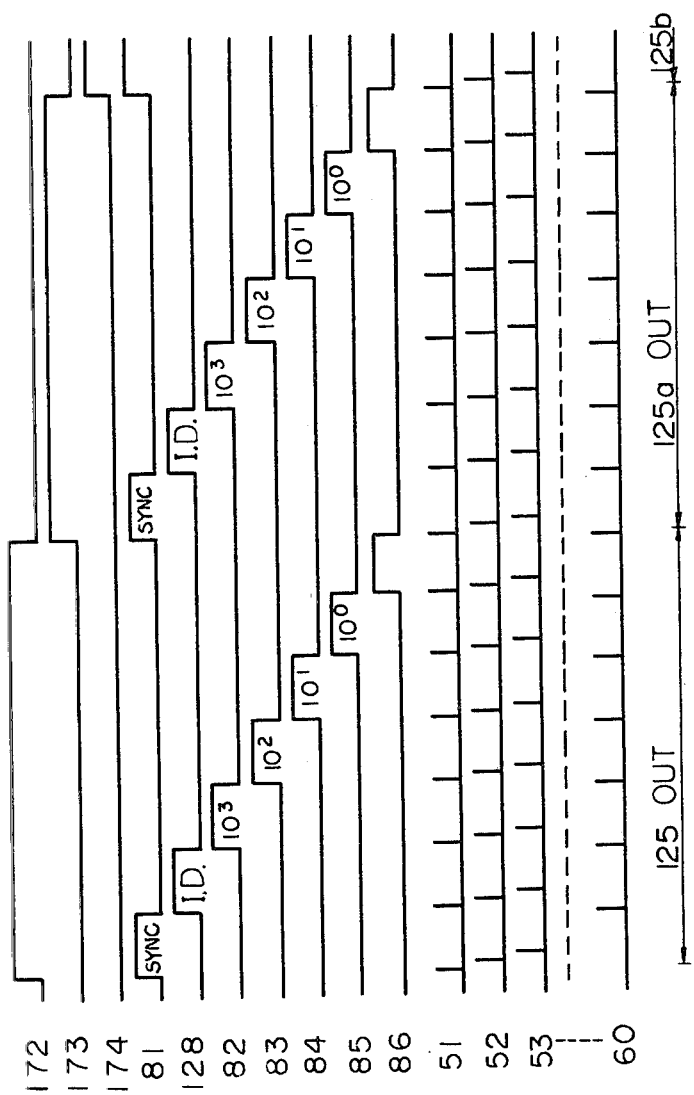

REMOTE METER READING APPARATUS

BACKGROUND OF THE INVENTION

The present invention relates to a remote meter reading apparatus for automatically reading utility meters from a central location.

Such systems are known in which a remote central meter reading unit feeds clock or interrogation pulses to a selected meter over a transmission line. In response, the meter feeds to the remote unit data signals corresponding to the utility meter reading. The utility may be electricity, water, gas or the like.

However, some means must be provided to synchronize the meter to the reading unit. One such expedient is to provide a clear circuit in the meter to determine the beginning of data transmission. This increases the cost of the meter by a considerable amount. Another expedient is to construct the meter to generate a start signal and an end signal preceeding and following the data signals respectively. This also adds to the cost and complexity of the meter and reading unit to an unacceptable extent.

It is also possible to construct the meter to generate a plurality of synchronization signals preceeding the data signals. However, it is difficult to distinguish the first synchronization signals from the final preceeding data signals in a binary data transmission system.

This problem may be overcome by providing the synchronization signals in the form of a code which does not correspond to any possible combination of data signals. However, this also increases the cost and complexity of the system to an unacceptable extent.

SUMMARY OF THE INVENTION

A remote meter reading apparatus embodying the present invention comprises meter means, reading means located remotely from the meter means and communication line means connecting the reading means to the meter means, the reading means being constructed to feed clock pulses to the meter means, the meter means being constructed to feed a predetermined number of synchronization signals followed by a predetermined number of meter data signals followed by a predetermined number of redundancy signals to the reading means in synchronism with the clock pulses. Bit counter means have a plurality of stages which sequentially produce high outputs in response to the clock pulses. Digit counter means have a plurality of stages which sequentially produce high outputs in response to overflow signals from the bit counter means. A plurality of AND gate means have gate inputs connected to the outputs of the stages of the bit counter means respectively. OR gate means have inputs connected to outputs of all of the AND gate means. A meter selectively connects inputs of the AND gate means to outputs of the stages of the bit counter means in accordance with a meter reading.

In accordance with the present invention, a remote meter reading unit feeds clock pulses to a meter over a transmission line. The meter, in synchronism with the clock pulses, feeds a predetermined number of synchronization pulses, a predetermined number of meter data signals and a predetermined number of redundancy signals back to the reading unit.

It is an object of the present invention to provide a remote meter reading apparatus which overcomes the drawbacks of the prior art and enables automatic remote meter reading with increased reliability.

It is another object of the present invention to provide a remote reading apparatus which features increased reliability in combination with low cost and complexity.

It is another object of the present invention to provide a generally improved remote meter reading apparatus.

Other objects, together with the foregoing, are attained in the embodiments described in the following description and illustrated in the accompanying drawing.

BRIEF DESCRIPTION OF THE DRAWING

FIGS. 7 to 10*b* are electrical schematic diagrams illustrating further embodiments of the present invention;

FIG. 11 is a timing diagram for the embodiment of FIG. 10*a*; *b* and

DESCRIPTION OF THE PREFERRED EMBODIMENTS

While the remote meter reading apparatus of the present invention is susceptible of numerous physical embodiments, depending upon the environment and requirements of use, substantial numbers of the herein shown and described embodiments have been made, tested and used, and all have performed in an eminently satisfactory manner.

Figure 1:
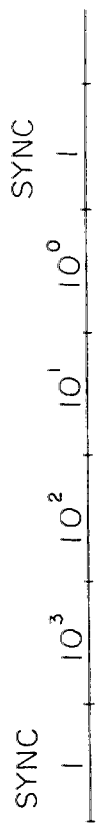
FIG. 1 is a diagram illustrating a prior art remote meter reading system.

FIG. 1 illustrates a prior art remote meter reading system for producing a four bit digital meter reading. A plurality of logically high or one sync bits are transmitted by the meter followed by the $10^3$, $10^2$, $10^1$ and $10^0$ bits of the meter reading followed by more logically high sync bits. The problem is that it is hard to distinguish the sync bits from logically high data bits occuring at the end of the data.

Figure 2:
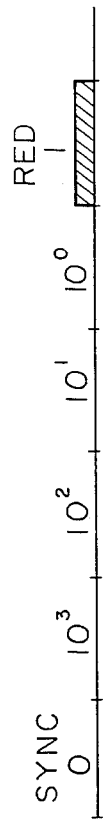
FIGS. 2 and 3 are similar to FIG. 1 but illustrate systems in accordance with the present invention.

This problem is overcome in accordance with the present invention as shown in FIG. 2 in which a plurality of logically high redundancy bits follow the data. Thus, it is easy to distinguish the first sync bit of the next group of sync signals. The sync bits are logically low.

Figure 3:
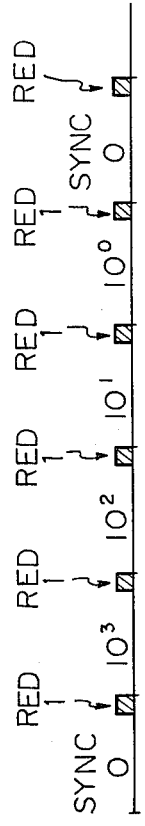

FIG. 3 shows another embodiment of the present invention in which a plurality of logically high redundancy bits follow each group of sync bits and also every digit of the meter reading.

Figure 4:
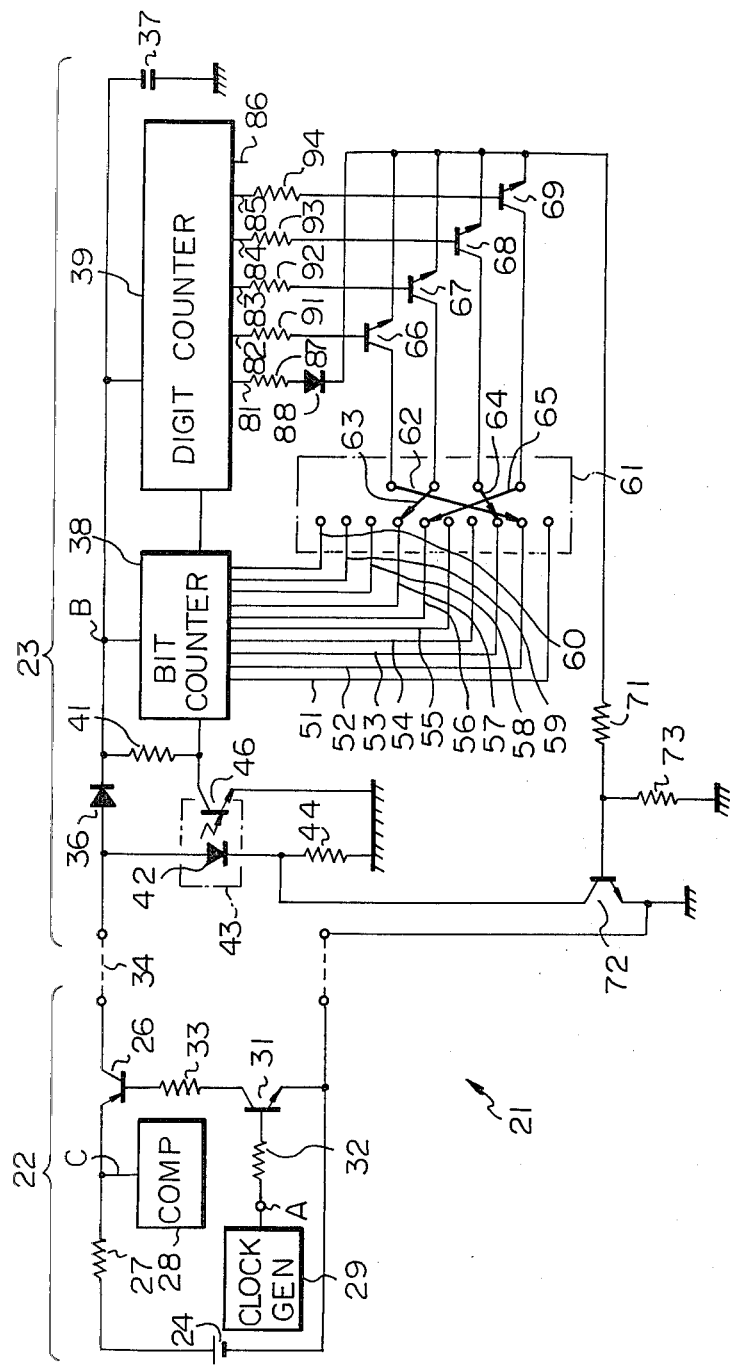
FIG. 4 is an electrical schematic diagram of a remote meter reading apparatus embodying the present invention.

FIG. 4 illustrates a remote meter reading apparatus embodying the present invention which is generally designated by the reference numeral 21. The apparatus 21 comprises a remote meter reading unit 22 and a utility meter unit 23.

The reading unit 22 comprises a power source 24 having a positive terminal connected to the emitter of a PNP transistor 26 through a resistor 27. A computing unit 28 is connected to the emitter of the transistor 26 at a junction designated as C. The negative terminal of the source 24 is grounded.

The output of a clock or interrogation pulse generator 29 is connected to the base of a transistor 31 through a resistor 32. The emitter of the transistor 31 is grounded wherein the collector of the transistor 31 is connected through a resistor 33 to the base of the transistor 26. The collector of the transistor 26 is connected through a transmission line 34 to the meter unit 23.

The meter unit 23 comprises a reverse blocking diode 36 having its anode connected to the line 34. The cathode of the diode 36 is connected to ground through a capacitor 37. The clock pulses from the generator 29 turn on the transistors 31 and 26 and connect the source 24 to the line 34. This results in clock pulses being applied to the line 34. The clock pulses charge the capacitor 37 which constitutes a power source for the meter unit 23. The capacitor 37 is connected to power supply inputs of a bit counter 38 and a digit counter 39.

The cathode of the diode 36 is connected through a pull-up resistor 41 to a count input of the counter 38. The line 34 is connected to the cathode of a light emitting diode (LED) 42 of an optocoupler 43, the cathode of the diode 42 being connected to ground through a resistor 44. The emitter of a phototransistor 46 of the optocoupler 43 is grounded, while the collector of the transistor 46 is connected to the count input of the counter 38. An overflow output of the bit counter 38 is connected to a count input of the digit counter 39.

The bit counter 38 has a modulo of ten and an internal decoder (not shown) which decodes the count of the counter and sequentially produces logically high stage outputs 51 to 60 in response to clock pulses. Each clock pulse on the line 34 causes the LED 43 to emit light which causes the phototransistor 46 to conduct. The input of the bit counter 38 is normally held high by the resistor 41. However, conduction of the phototransistor 46 connects the input of the bit counter 38 to ground and causes the bit counter 38 to increment.

The meter unit 23 further comprises a utility meter 61 which has four moving switch contacts 62 to 65 which are each connectable to any of the outputs 51 to 60. The positions of the contacts 62 to 65 correspond to the meter reading. As illustrated, the contacts 62 to 65 are connected to the outputs 52, 56, 53 and 55 respectively. Where the outputs 51 to 60 correspond to the digits 0 to 9 respectively, the illustrated meter reading is 1625.

The contacts 62 to 65 are connected to the collectors of NPN transistors 66 to 69 respectively which constitute AND gate means. The emitters of the transistors 66 to 69 are commonly connected through a resistor 71 to the base of an NPN transistor 72. This constitutes a wired OR gate connection which performs the function of an OR gate means. A resistor 73 is connected between the base of the transistor 72 and ground. The emitter of the transistor 72 is grounded whereas the collector of the transistor 72 is connected to the cathode of the LED 42.

The construction of the digit counter 39 is similar to that of the bit counter 38. The digit counter 39 produces sequentially high stage outputs 81 to 86 in response to overflow signals from the bit counter 38. The output 81 is connected through a resistor 87 to the anode of a reverse blocking diode 88, the cathode of which is connected to the emitters of the transistors 66 to 69. The outputs 82 to 85 are connected through resistors 91 to 94 to the bases of the transistors 66 to 69 respectively. The output 86 is unconnected.

Figure 6:
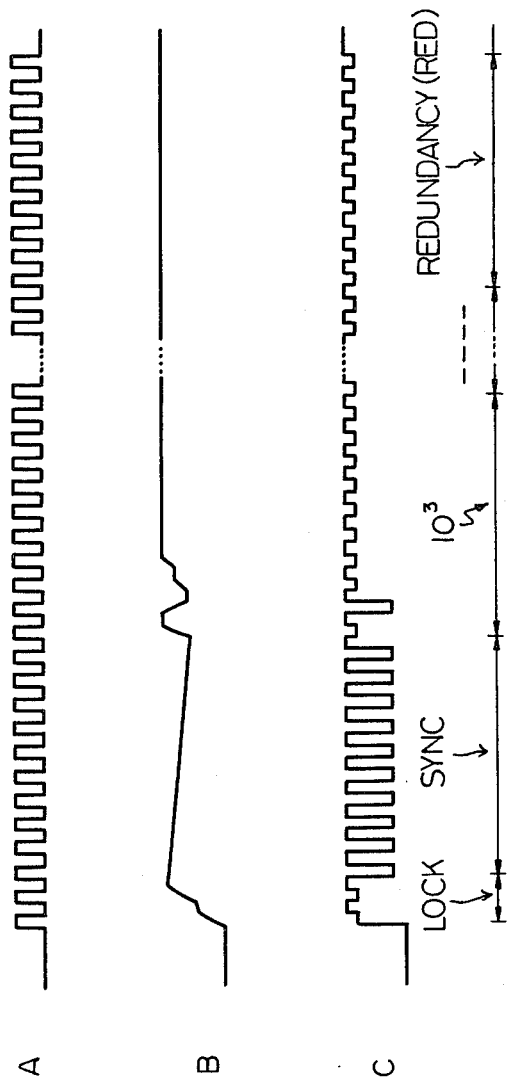
FIG. 6 is a timing diagram for the embodiment of FIG. 4.

As illustrated in FIG. 6, the clock pulses produced by the generator 29 are designated as A whereas the voltage across the capacitor 37 is designated as B. Initially, the counters 38 and 39 are at random and unknown counts. Thus, during a lock phase, the transistor 72 remains turned off and the voltage at the point C remains high. The resistor 44 is selected to have a large value compared to the resistor 27 so that conduction of the transistor 26 causes only a small voltage drop at the point C.

When the digit counter 39 overflows to the count of zero, the output 81 will go high and turn on the transistor 72. This will short out the resistor 44 and connect the point C to ground during the clock pulses when the transistor 26 conducts. The bit counter 38 will overflow after receiving ten additional clock pulses and increment the digit counter 39 to the count of one. The ten clock pulses applied to the meter unit 23 while the count in the counter 39 is zero will result in the production of ten logically low sync pulses as shown in FIG. 6.

When the count in the counter 39 is incremented to one, the output 82 goes high. This turns on the transistor 66. At this time the output 51 of the bit counter 38 is high. However, the transistor 66 does not produce a high signal at its emitter since the contact 62 is not connected to the high output 51. The transistor 72 remains turned off and the voltage at the point C remains high.

In response to the next clock pulse, the output 52 of the bit counter 38 goes high. The transistor 66 remains turned on by the high output 82 of the digit counter 39. The high output 52 of the counter 38 is passed through the transistor 66 to the transistor 72 to turn on the transistor 72. This results in a logically low signal at the point C, corresponding to the digit, in this case one, of the meter reading. In response to the next 8 clock pulses the voltage at the point C will remain high.

The tenth clock pulses will cause the counter 88 to overflow and increment the counter 39. The output 83 will go high to turn on the transistor 67. The voltage at the point C will go low when the output 57 of the counter 38 goes high since the second digit of the meter reading is six and the contact 63 is connected to the output 57. The next digits two and five of the meter reading will be output in a similar manner when the outputs 84 and 85 respectively of the counter 39 go high in sequence.

Thereafter, the output 86 of the counter 39 will go high. Since the output 86 is unconnected, the transistor 72 will remain turned off and the voltage at the point C will remain high for the next ten clock pulses to produce ten logically high redundancy signals.

In summary, the meter unit 23 automatically locks into an initial mode and produces ten logically low synchronization pulses in response to clock pulses generated by the reading unit 22. Low pulses corresponding to the digits of the meter reading are then produced in response to the next four groups of ten clock pulses. Finally, ten logically high redundancy signals are produced in response to the next ten clock pulses. The computing unit 28 stores the meter reading for future billing of the customer.

Figure 5:
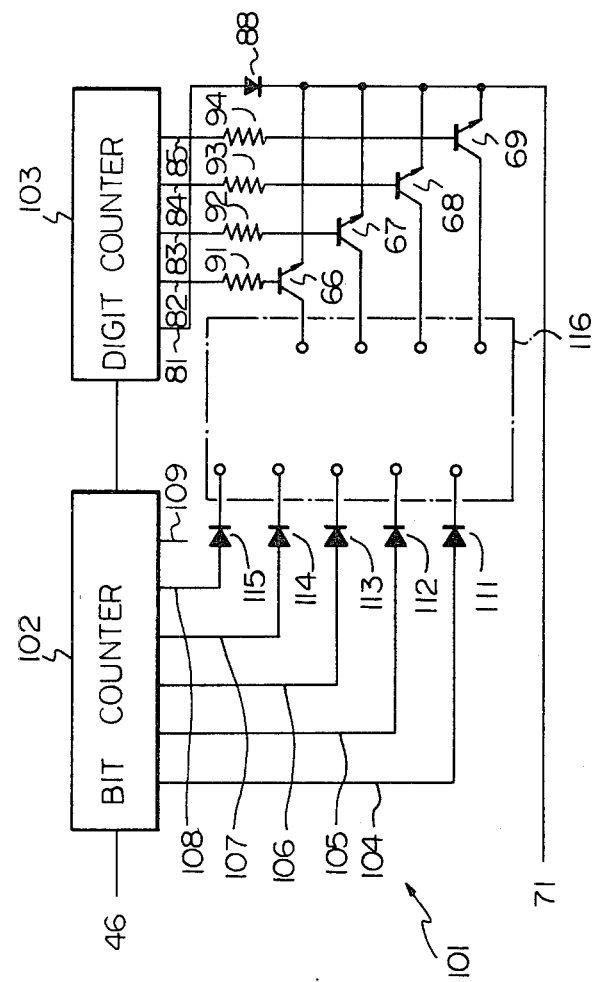
FIG. 5 shows another embodiment of the present invention.

Whereas the apparatus 21 produces the signals illustrated in FIG. 2, another apparatus 101 illustrated in FIG. 5 produces the signals shown in FIG. 3. The apparatus 101 comprises a binary coded decimal (BCD) bit counter 102 having outputs 104 to 108 which go sequentially high in response to clock pulses and are connected to anodes of diodes 111 to 115 respectively. A last output 109 is unconnected. A digit counter 103 is identical to the digit counter 39 except that it does not have the last unconnected output 86. Like elements are designated by the same numerals used in FIG. 4. A modified meter 116 is constructed to connect the collectors of the transistors 66 to 69 to the cathodes of the diodes 111 to 115 to constitute the meter reading.

In this case, groups of six rather than ten clock pulses are applied to the counter 102 to produce a BCD meter reading. The transistor 72 unconditionally remains turned off so that the voltage at the point C remains high in response to each sixth clock pulse due to non-connection of the output 109, thereby producing one logically high redundancy signal following each group of five sync signals and also following each group of five meter data signals. It will be understood that each digit of the meter reading is constituted by a five bit BCD byte.

Figure 7:
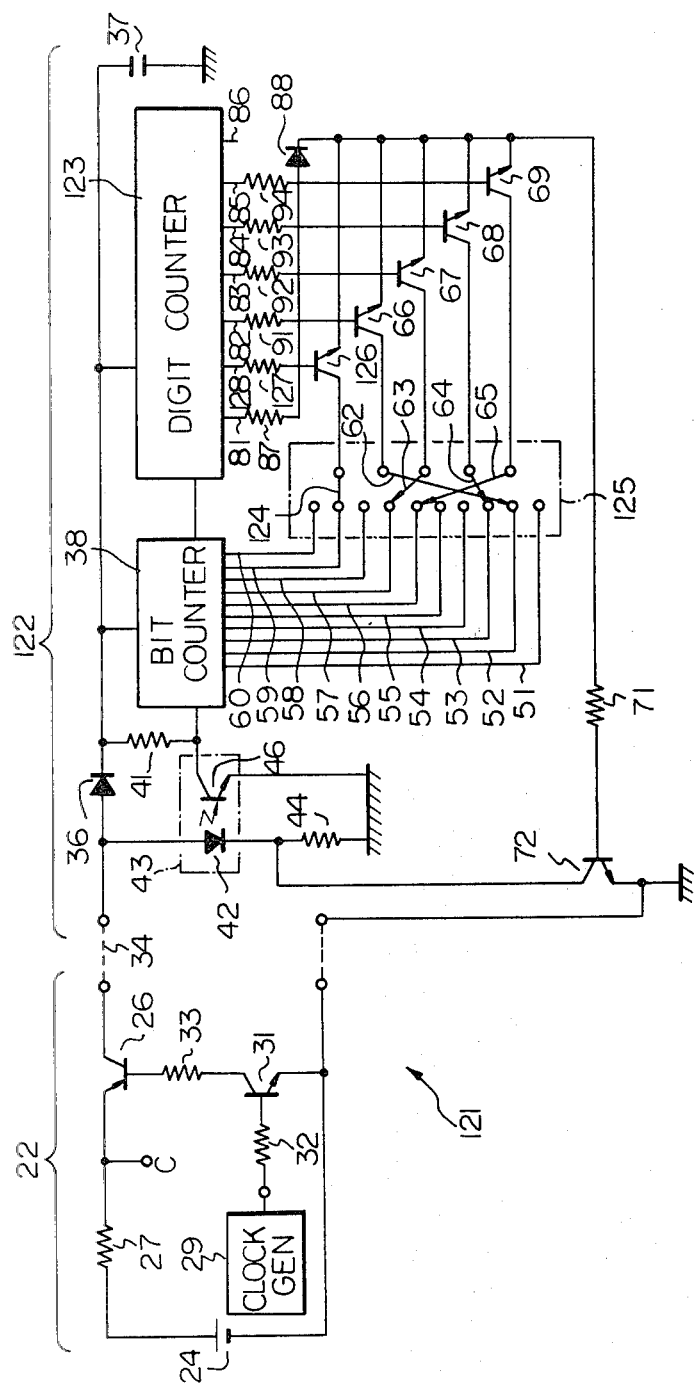

Another embodiment of the present invention is shown in FIG. 7 and designated as 121. It is desired that the meter reading contain an indication of the type of meter, thus reducing the load required of the reading unit 22 and facilitating the changing of meters and the occupant's room number.

A modified meter unit 122 comprises a digit counter 123 having an extra stage 128 between the stages 81 and 82. The stage output 128 is connected to the base of a transistor 126 through a resistor 127. The emitter of the transistor 126 is connected to the emitters of the transistors 66 to 69. The collector of the transistor 126 is connected to a switch contact 124 of a modified meter 125. The contact 124 is manually movable into engagement with either of the outputs 58, 59 and 60 of the bit counter 38. The outputs 58, 59 and 60 indicate that the meter 125 is a water, gas or electric meter respectively. The meter indication or identification provided by the switch 124 is output in the same manner as a digit during the second set of ten clock pulses when the output 128 of the digit counter 123 is high.

Figure 8:
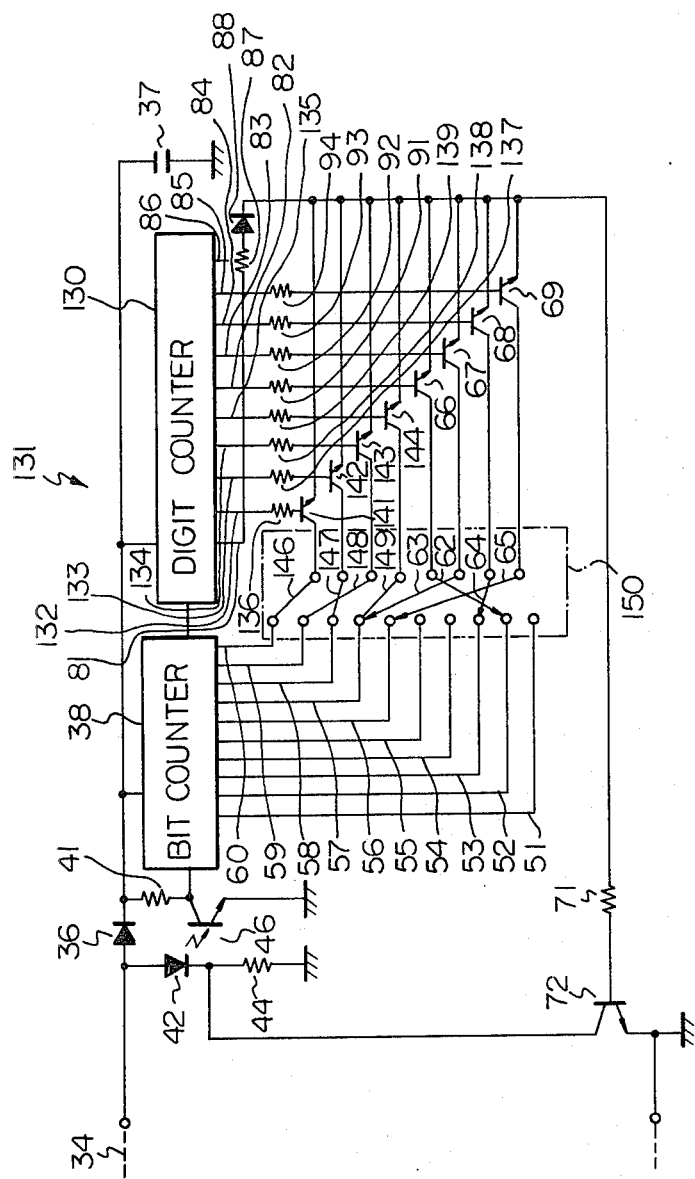

This embodiment is further elaborated upon in a meter unit 131 shown in FIG. 8. A modified digit counter 130 comprises four stages 132 to 135 between the stages 81 and 82. These stages 132 to 135 are connected through resistors 136 to 139 to transistors 141 to 144 in the manner described above. The collectors of the transistors 141 to 144 are connected to movable switch contacts 146 to 149 of a modified meter 150. The contacts 146 to 149 are manually and independently movable into engagement with any of the outputs 51 to 60 of the bit counter 38 to constitute a four digit address code indicating the number or address of the customer's meter.

Figure 9:
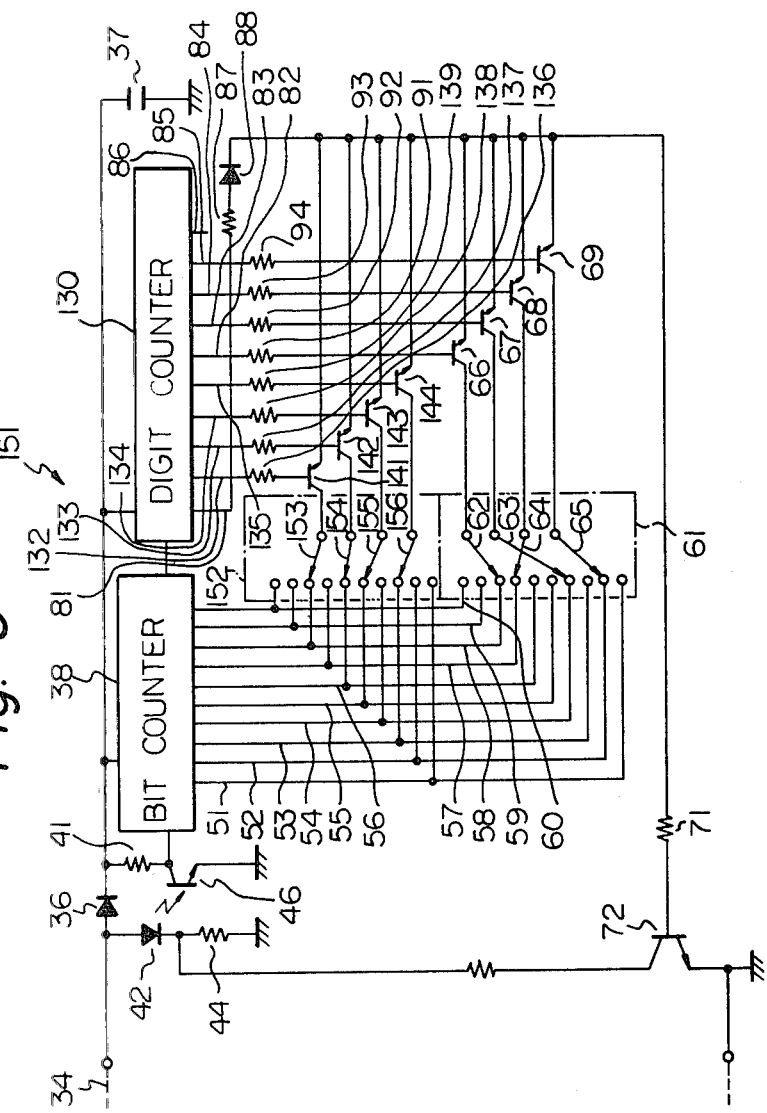

FIG. 9 shows another meter unit 151 embodying the present invention comprising like elements designated by the same reference numerals as in FIG. 8. However, the contacts 146 to 149 are replaced by an auxiliary meter 152 having contacts 153 to 156 connected to the collectors of the transistors 141 to 144 respectively. The meter 152 is identical to the meter 61 but is used to measure the consumption of another utility at the same location. For example, the meter 61 may measure the consumption of the gas whereas the meter 152 may measure the consumption of electricity.

Figure 10B:
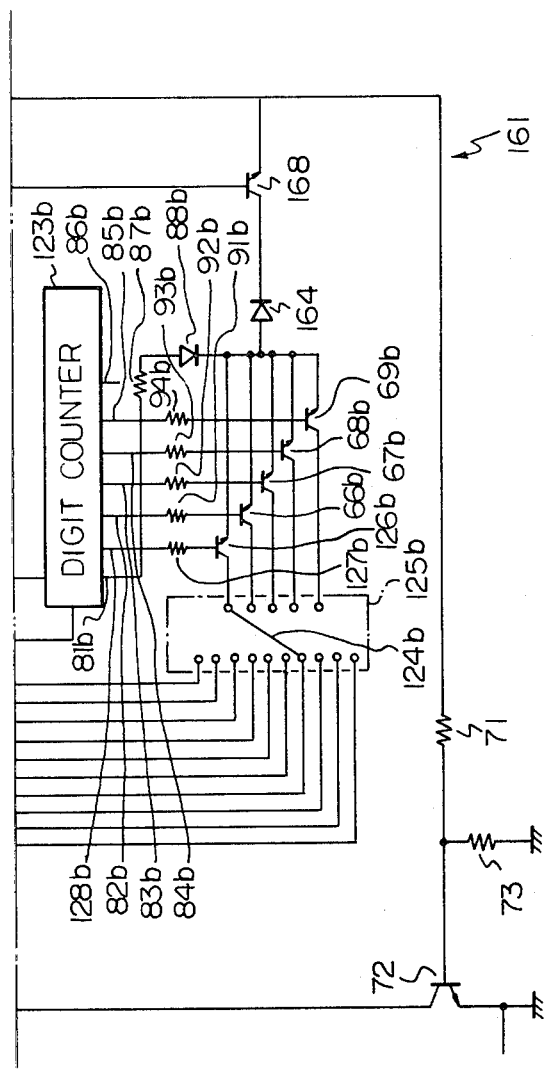

FIG. 10 illustrates another meter unit embodying the present invention which is designated as 161 and comprises the elements illustrated in FIG. 7. In addition, the unit 161 comprises two auxiliary sets of the digit counter 123, meter 125 and associated circuitry which are designated by the same reference numerals suffixed by the characters a and b respectively. The emitters of the transistors 126 and 66 to 69 are connected to the anode of a reverse blocking diode 162. The emitters of the transistors 126a and 66a to 69a are connected to the anode of reverse blocking diode 163.

The emitters of the transistors 126b and 66b to 69b are connected to the anode of a reverse blocking diode 164. The cathodes of the diodes 162 to 164 are connected to the collectors of NPN transistors 166, 167 and 168 respectively which constitute selector AND gate means. The emitters of the transistors 166 to 168 are wired together to constitute a wired selector OR gate means which is additionally connected to the resistor 71.

The unit 161 further comprises a meter counter 171 which is a modulo three counter having output stages 172 to 174 which go high sequentially in response to overflow outputs of the digit counter 123. The outputs 172 to 174 are connected through resistors 175 to 177 to the bases of the transistors 166 to 168 respectively.

When the power is applied to the unit 161, one of the outputs 172 to 174 of the meter counter 171 will be high and turn on one of the transistors 166 to 168. This will select one of the meters 125, 125a or 125b to output its respective meter reading first. Where, for example, the meters 125, 125a and 125b measure the consumption of water, gas and electricity respectively, ambiguity as to which meter is being read is eliminated by means of the identification contacts 124, 124a and 124b. The meter counter 171 is incremented by the overflow outputs of the digit counter 123 to sequentially read the three meters 125, 125a and 125b. FIG. 11 is a timing diagram of the operation of the unit 161.

Figure 12:
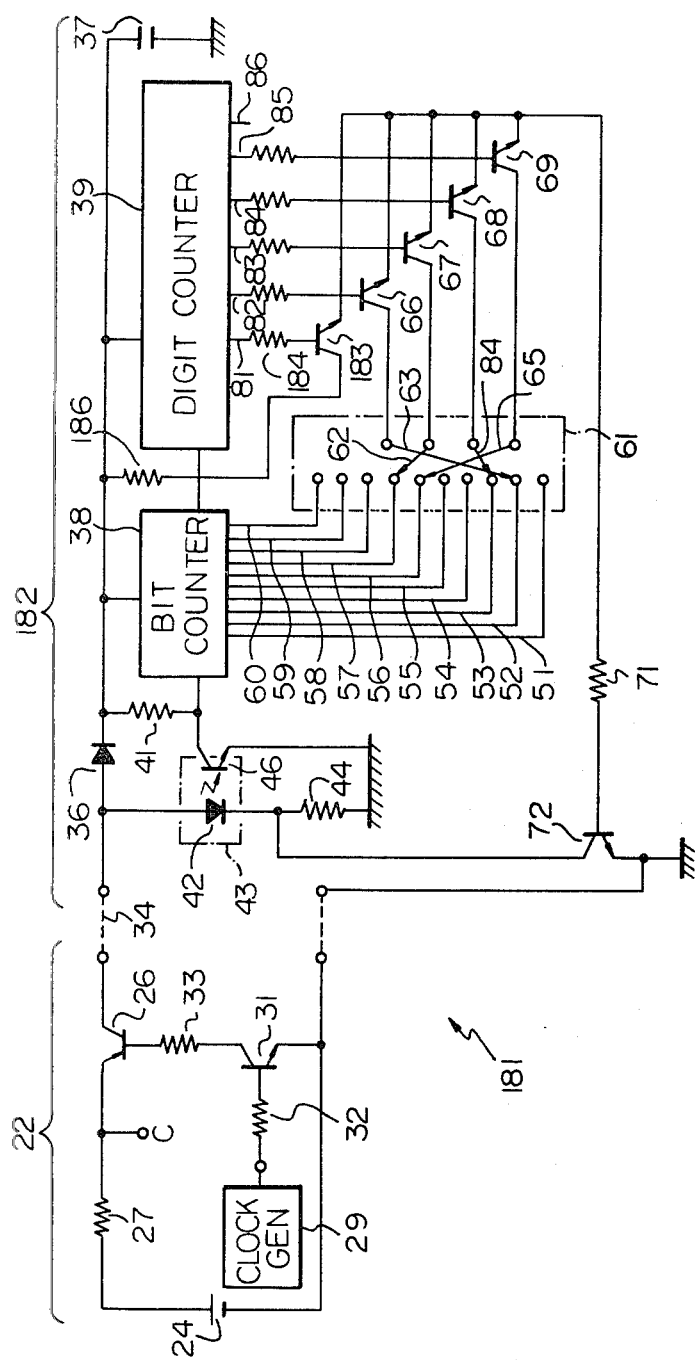
FIGS. 12 and 13 are electrical schematic diagrams illustrating further embodiments of the present invention.

FIG. 12 illustrates another embodiment of the present invention which is designated as 181 and comprises a meter unit 182. The unit 182 differs from the unit 23 in that the diode 88 is replaced by an NPN transistor 183. The collector of the transistor 183 is connected to the cathode of the diode 36 whereas the emitter of the transistor 183 is connected to the emitters of the transistors 66 to 69. The base of the transistor 183 is connected to the output 81 of the digit counter 39 through a resistor 184. This arrangement reduces the source current requirement of the output 81.

Figure 13:
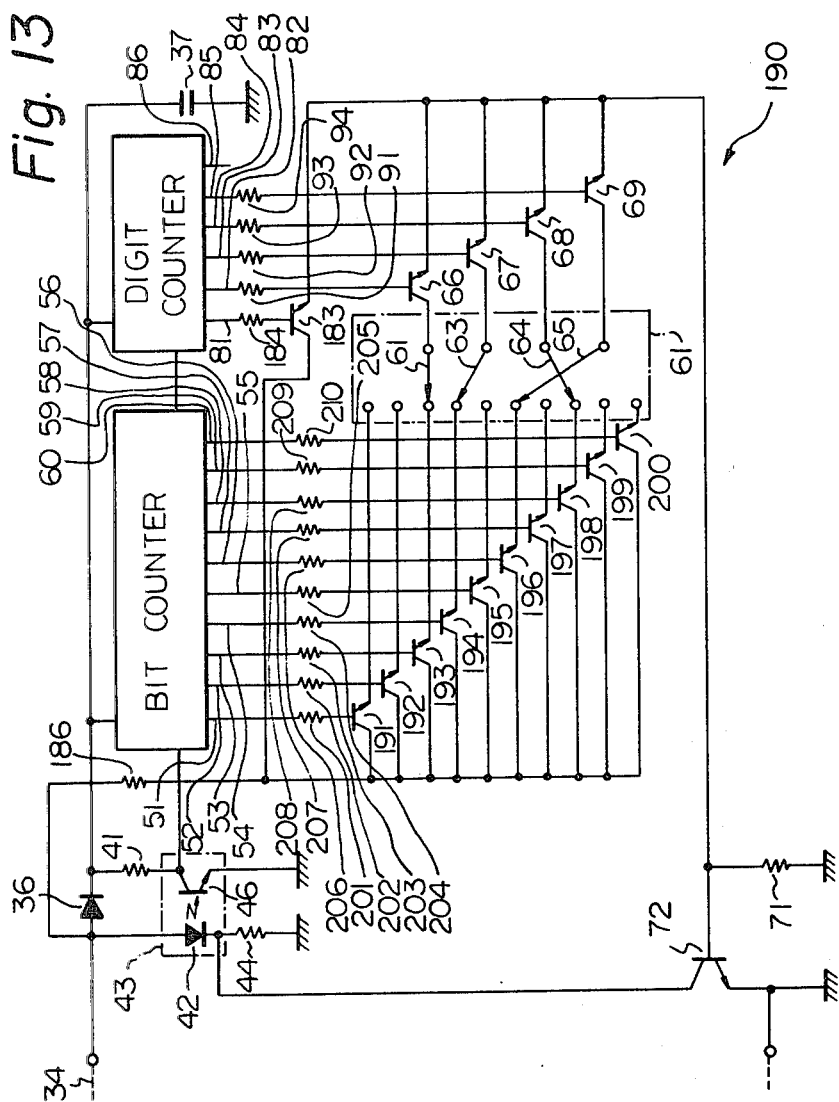

FIG. 13 illustrates another meter unit 190 which comprises power transistors 191 to 200 having their bases connected through resistors 201 to 210 to the outputs 51 to 60 of the bit counter 38. The emitters of the transistors 191 to 200 are connected to the meter 61 whereas the collectors of the transistors 191 to 200 are connected through the resistor 186 to the line 34. This arrangement reduces the power requirement of the capacitor 37 and increases the operating margin of the circuit since the power for the contacts of the switch 61 is provided by the line 34 rather than the capacitor 37. In addition, the source current requirement for the bit counter 38 is greatly reduced.

In summary, it will be seen that the present invention overcomes the drawbacks of the prior art and provides a remote meter reading apparatus which is simple in construction yet more effective in operation compared to the prior art. Various modifications will become possible for those skilled in the art after receiving the teachings of the present disclosure without departing from the scope thereof. For example, the present apparatus may utilize negative logic rather than positive logic as shown and described since such a modification would result in a mechanically equivalent apparatus.

What is claimed is:

1. A remote meter reading apparatus comprising meter means, reading means located remotely from the meter means and communication line means connecting the reading means to the meter means, the reading means being constructed to feed clock pulses to the meter means, the meter means being constructed to feed a predetermined number of synchronization signals followed by a predetermined number of meter data signals followed by a predetermined number of redundancy signals to the reading means in response to and in synchronism with the clock pulses, the synchronization signals and the redundancy signals being different from each other.

2. An apparatus as in claim 1, in which the meter means comprises bit counter means having a plurality of stages which sequentially produce high outputs in response to the clock pulses, digit counter means having a plurality of stages which sequentially produce high outputs in response to overflow signals from the bit counter means, a plurality of AND gate means having gate inputs connected to the outputs of the stages of the bit counter means respectively, OR gate means having inputs connected to outputs of all of the AND gate means and a meter for selectively connecting inputs of the AND gate means to outputs of the stages of the bit counter means in accordance with a meter reading.

3. An apparatus as in claim 2, in which the meter means comprises a capacitor which is charged by the clock pulses and constitutes a power source for the bit counter means and the digit counter means.

4. An apparatus as in claim 2, in which the digit counter means further comprises a first stage which produces a high output before said stages of the digit counter means and is connected to an input of the OR gate means.

5. An apparatus as in claim 2, in which the digit counter means further comprises an unconnected last stage which produces a high output after said stages of the digit counter means.

6. An apparatus as in claim 2, in which the bit counter means comprises an unconnected last stage which produces a high output after said stages of the bit counter means.

7. An apparatus as in claim 2, further comprising power gate means connected between the stages of the bit counter means and the meter means respectively in such a manner that gate inputs of the power gate means are connected to the stages of the bit counter means and outputs of the power gate means are connected to the meter, inputs of all of the power gate means being connected to the communication line means.

8. An apparatus as in claim 2, in which the digit counter means further comprises an auxiliary stage, the meter means further comprising an auxiliary AND gate means having a gate input connected to an auxiliary stage output of the digit counter means an output connected to an input of the OR gate means and switch means for connecting an input of the auxiliary AND gate means to a selected one of the stage outputs of the bit counter means.

9. An apparatus as in claim 2, in which the meter comprises first and second independent meter sections for providing first and second meter readings respectively.

10. An apparatus as in claim 2, in which the meter means further comprises auxiliary digit counter means having a plurality of stages which sequentially produce high outputs in response to overflow signals from the bit counter means, a plurality of auxiliary AND gate means having gate inputs connected to outputs of the stages of the bit counter means respectively, auxiliary OR gate means having inputs connected to outputs of all of the auxiliary AND gate means, an auxiliary meter for selectively connecting inputs of the auxiliary AND gate means to outputs of the stages of the bit counter means in accordance with an auxiliary meter reading, meter counter means having first and second stages which sequentially produce high outputs in response to overflow signals from said digit counter means, selector AND gate means having gate inputs connected to outputs of the stages of the selector gate means respectively and inputs connected to outputs of said OR gate means and the auxiliary OR gate means respectively and selector OR gate means having inputs connected to outputs of the selector AND gate means respectively.

11. A remote meter reading apparatus comprising meter means, reading means located remotely from the meter means and communication line means connecting the reading means to the meter means, the reading means being constructed to feed clock pulses to the meter means, the meter means being constructed to feed a predetermined number of synchronization signals followed by a predetermined number of meter data signals followed by a predetermined number of redundancy signals to the reading means in synchronism with the clock pulses;

the meter means comprising bit counter means having a plurality of stages which sequentially produce high outputs in response to the clock pulses, digit counter means having a plurality of stages which sequentially produce high outputs in response to overflow signals from the bit counter means, a plurality of AND gate means having gate inputs connected to the outputs of the stages of the bit counter means respectively, OR gate means having inputs connected to outputs of all of the AND gate means and a meter for selectively connecting inputs of the AND gate means to outputs of the stages of the bit counter means in accordance with a meter reading.

* * * * *